ized Patent [19]

United States Patent [19]

Kim et al.

[11] Patent Number: 5,444,005

[45] Date of Patent: Aug. 22, 1995

[54] METHOD FOR MANUFACTURING A CAPACITOR OF A SEMICONDUCTOR MEMORY DEVICE

[75] Inventors: Yun-gi Kim, Wonju; Fui-song Kim, Incheon; Jin-seok Choi, Suwon; Jong-ho Park, Kangnam-gu, all of Rep. of Korea

[73] Assignee: Samsung Electronics Co., Ltd., Kyungki-do, Rep. of Korea

[21] Appl. No.: 246,277

[22] Filed: May 19, 1994

[30] Foreign Application Priority Data

May 19, 1993 [KR] Rep. of Korea .............. 93-8579

[51] Int. Cl.⁶ .................. H01L 21/70; H01L 27/00
[52] U.S. Cl. ........................ 437/52; 437/60; 437/919
[58] Field of Search ............... 437/47, 52, 60, 919

[56] References Cited

U.S. PATENT DOCUMENTS 5,346,847  9/1994  Jun ............................. 437/60
5,358,888  10/1994  Ahn et al. .................... 437/52

Primary Examiner—George Fourson
Assistant Examiner—H. Jey Tsai
Attorney, Agent, or Firm—Charles R. Donohoe; Robert A. Westerlund, Jr.; Stephen R. Whitt

[57] ABSTRACT

A method for manufacturing a capacitor of a semiconductor memory device. A conductive layer is formed on the semiconductor substrate and a photoresist pattern is formed on the conductive layer. The conductive layer is etched, using the photoresist pattern as a mask to form a first step-portion in the conductive layer. A first spacer is formed on a sidewall of the photoresist pattern, which may be formed by flowing the photoresist pattern. The conductive layer is etched, using the first spacer as a mask, to form a second step-portion in the conductive layer. The photoresist pattern and the first spacer is removed. A first material layer is formed on the entire surface of the resultant structure and etched to form a second spacer on the sidewalls of the first and second step-portions. The conductive layer is etched, using the second spacer as a mask, to form a storage electrode of a capacitor. Cell capacitance may be increased by a simple process, and the heat cycle may be reduced.

23 Claims, 16 Drawing Sheets

METHOD FOR MANUFACTURING A CAPACITOR OF A SEMICONDUCTOR MEMORY DEVICE

BACKGROUND OF THE INVENTION

The present invention relates to a method for manufacturing a capacitor for a semiconductor memory device, and particularly to a method for manufacturing a capacitor for a semiconductor memory device with increased cell capacitance.

Reduced memory cell area can lead to decreased cell capacitance, which is a serious obstacle to increasing the packing density of a dynamic random access memory (DRAM). Decreased cell capacitance results in degraded read-out capability, an increase in the soft error rate of the memory cell, excessive power consumption during low voltage operation. Thus, increasing unit area cell capacitance is desirable in order to increase packing density.

Recently, many methods for increasing cell capacitance have been proposed, which generally relate to either improving the structure of the capacitor storage electrode or changing the characteristics of the storage electrode material. An example of a method of the first type involves increasing the effective capacitor area by forming a storage electrode having a three-dimensional structure, e.g., a cylindrical structure.

FIGS. 1 through 4 are cross-sectional views illustrating a conventional method for manufacturing a cylindrical storage electrode having a bar electrode therein, as disclosed in U.S. patent application Ser. No. 07/917,182.

Referring to FIG. 1, a pair of transistors each having a source region 14 and a gate electrode 18 and commonly sharing a drain region 16 and a bit line 20 are formed on the active region of a semiconductor substrate 10. Substrate 10 is divided into active and isolation regions by a field oxide 12. Insulating layer 19 is formed on the entire surface of the resultant structure for insulating the transistors. Planarizing layer 40 is formed for planarizing the surface of substrate 10, and silicon nitride ($Si_3N_4$) is deposited to a thickness of 30~300 Å on planarizing layer 40 to form an etch-blocking layer 42. An oxide is deposited to a thickness of about 1,000 Å on etch-blocking layer 42 to form sacrificial layer 44. Then, sacrificial layer 44, etch-blocking layer 42, planarizing layer 40 and insulating layer 19 are selectively removed to form a contact hole (not shown). Thereafter, a conductive material, e.g., an impurity-doped polycrystalline silicon, is deposited on the entire surface of the resultant structure, to form first conductive layer 50 having a thickness of about 5,000 Å and filling the contact hole. An oxide and a polycrystalline silicon are sequentially deposited on first conductive layer 50, each to a thickness of about 500 Å, to form oxide film 52 and second conductive layer 54, respectively.

Referring to FIG. 2, storage electrode pattern 54a is formed by patterning second conductive layer 54 according to a photo-lithography process, and oxide film 52 is wet-etched to thereby form bar electrode etch-mask 52a. Thereafter, polycrystalline silicon is deposited to a thickness of about 1,000 Å on the entire surface of the resultant structure to form a third conductive layer 56, and an oxide is deposited to a thickness of about 1,000 Å on third conductive layer 56. Then, the oxide film is anisotropically etched to form spacer 58 on the sloped side portions of third conductive layer 56.

Referring to FIG. 3, an anisotropic etching process is performed on the entire surface of the resultant structure of FIG. 2, using spacer 58 and etch-mask 52a as a mask and using sacrificial layer 44 as an etch-end point, to form storage electrode 100 composed of bar electrode 100a and cylindrical electrode 100b.

Referring to FIG. 4, after removing spacer 58, etch-mask 52a and sacrificial layer 44 by a wet etching process, a high dielectric material is coated on the entire surface of storage electrode 100, to thereby form dielectric film 110. Then, a conductive material, e.g., an impurity-doped polycrystalline silicon, is deposited on dielectric film 110 to form plate electrode 120. Resulting capacitors C1 and C2 are composed of storage electrode 100, dielectric film 110 and plate electrode 120.

This conventional method is simple and has a large process margin. However, storage electrode height is limited due to the step-difference problem in the subsequent metallization process. Accordingly, the cell capacitance required for highly integrated semiconductor memory devices (256 Mb and higher) cannot be realized using this method.

SUMMARY OF THE INVENTION

Accordingly, it is an object of the present invention to provide a method for manufacturing a capacitor for a semiconductor memory device with increased cell capacitance.

To accomplish this object and achieve other advantages, there is provided a method for manufacturing a semiconductor memory device capacitor comprising the steps of:

forming a conductive layer on a semiconductor substrate;

forming a photoresist pattern on the conductive layer;

etching the conductive layer, using the photoresist pattern as a mask, to form a first step-portion in the conductive layer;

forming a first spacer on a sidewall of the photoresist pattern;

etching the conductive layer, using the first spacer as a mask, to form a second step-portion in the conductive layer;

removing the photoresist pattern and the first spacer;

forming a first material layer on the resultant structure;

etching the first material layer to form a second spacer on a sidewall of the first and second step-portions;

etching the conductive layer, using the second spacer as a mask, to form a storage electrode; and removing the second spacer.

The first spacer may be formed by flowing the photoresist pattern so that it diffuses laterally in a generally elliptical pattern. Alternatively, an anisotropic plasma etching process can be performed to form a spacer composed of an etch by-product, e.g., a polymer. As another alternative, an oxide such as silane-based oxide or plasma-enhanced tetraethlyorthosilicate (PE-TEOS) based oxide, may deposited at a low temperature (below 200° C.) and etched anisotropically.

According to the present invention, cell capacitance can be increased and a heat cycle can be reduced.

BRIEF DESCRIPTION OF THE DRAWINGS

The above objects and other advantages of the present invention will become more apparent upon taking the following detailed description of preferred embodiments thereof in conjunction with the attached drawings in which.

DETAILED DESCRIPTION OF PRESENTLY PREFERRED EMBODIMENTS

Figure 1:
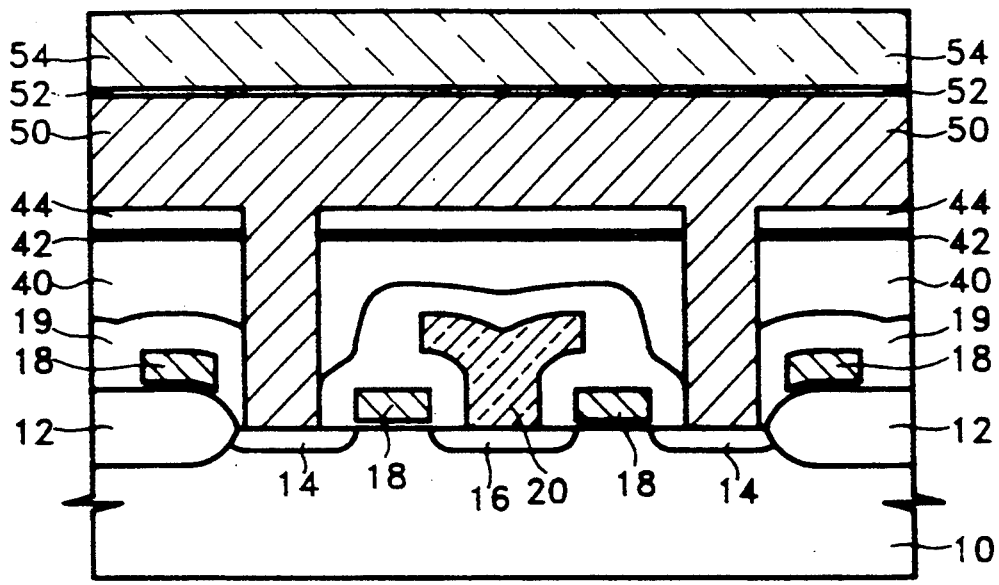
FIGS. 1 through 4 are cross-sectional views illustrating a conventional method for manufacturing a semiconductor memory device capacitor.
Figure 2:
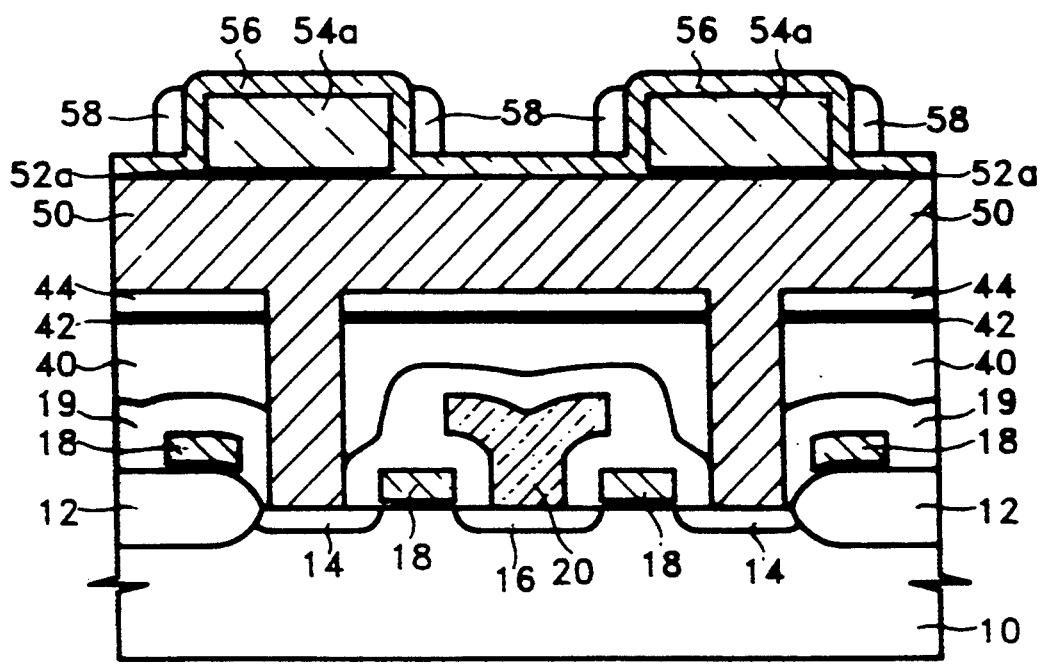
Figure 3:
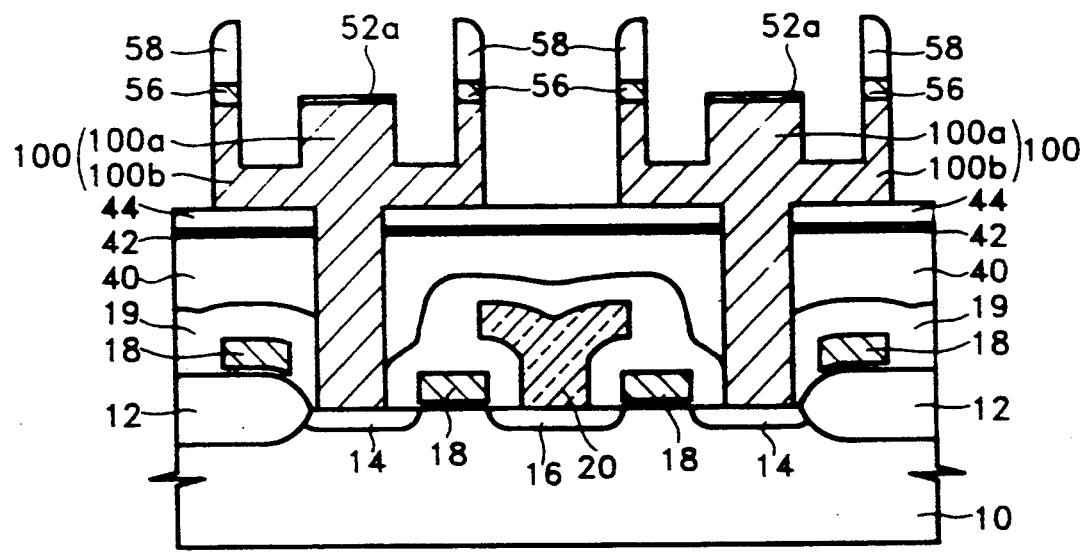
Figure 4:
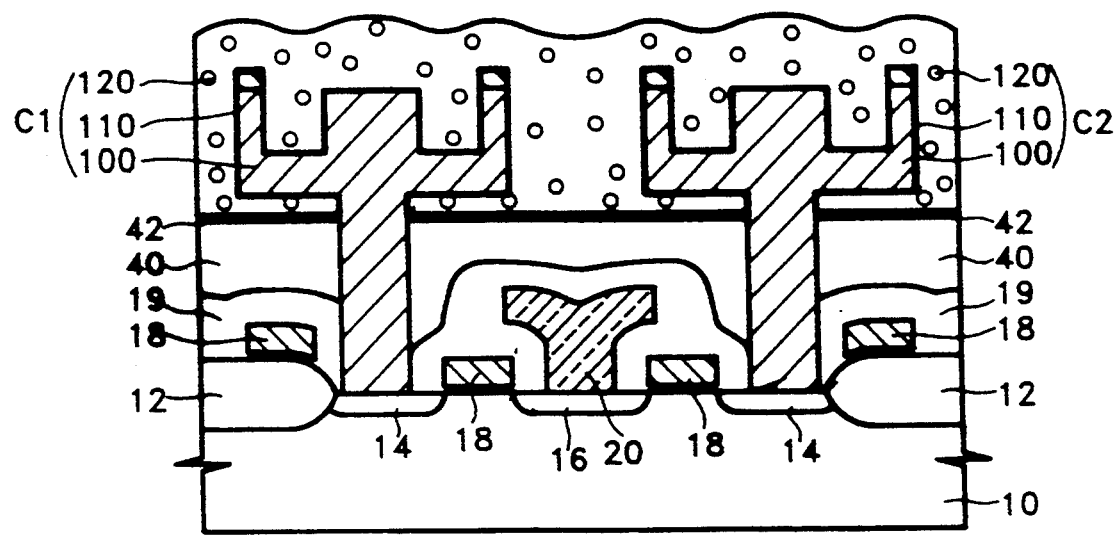
Figure 5:
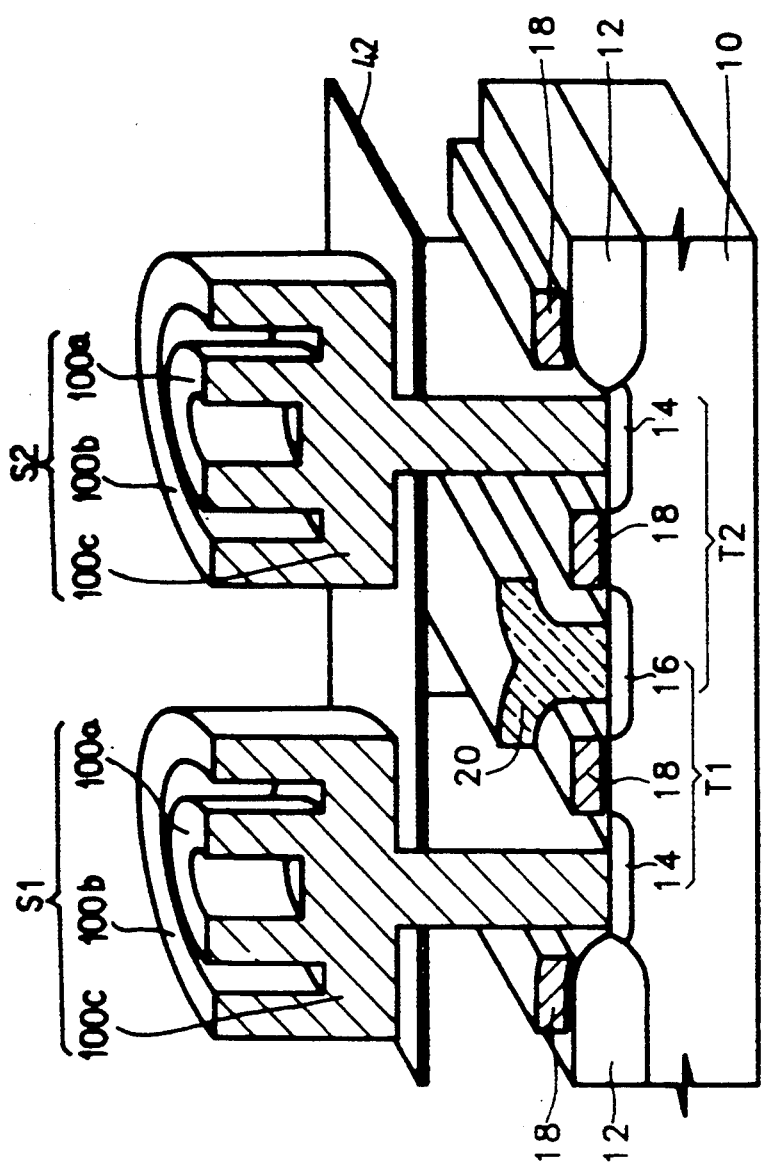
FIG. 5 is a perspective view of a semiconductor memory device manufactured according to the present invention.

Referring to FIG. 5, a pair of transistors T1 and T2, each having a source region 14 and a gate electrode 18 and commonly sharing a drain region 16, are formed on an active region between field oxides 12 in a semiconductor substrate 10. Each gate electrode 18 extends lengthwise and serves as a word line, and a bit line 20 is connected to drain region 16. Storage electrodes S1 and S2 are connected respectively to each of source regions 14.

Each storage electrode S1 and 22 is composed of inner and outer cylindrical electrodes 100a and 100b and base electrode 100c. Base electrode 100c is connected with the cylindrical electrodes 100a and 100b, and the bottom surface of base electrode 100c is part of the effective capacitor area.

Figure 6:
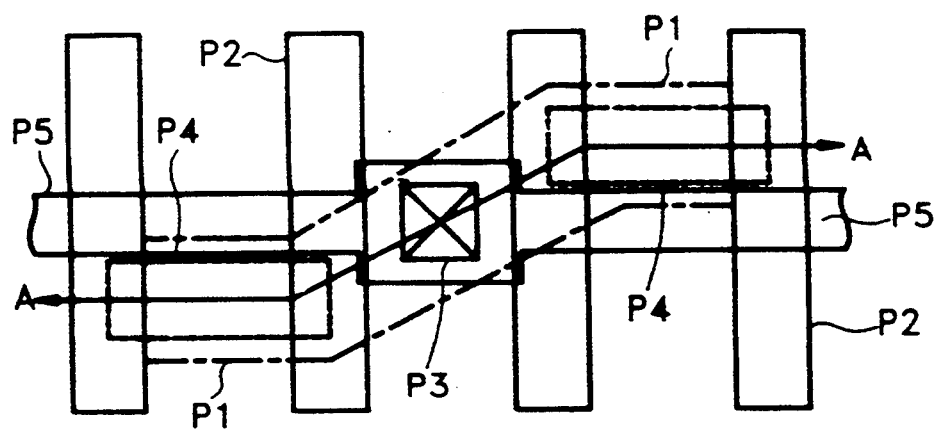
FIG. 6 is a layout diagram for manufacturing a semiconductor memory device according to the present invention.

Referring now to FIG. 6, mask pattern P1 is used to form a field oxide for dividing the semiconductor substrate into an active region and an isolation region. Mask pattern P2 is used to form a gate electrode, mask pattern P3 is used to form a contact hole connecting a bit line to the drain region of a transistor, P4 mask pattern is used to form a storage electrode, and mask pattern P5 is used to form a bit line.

The layout diagram of FIG. 6 is exemplary, and may be used for all of the embodiments the present invention described below.

Figure 7:
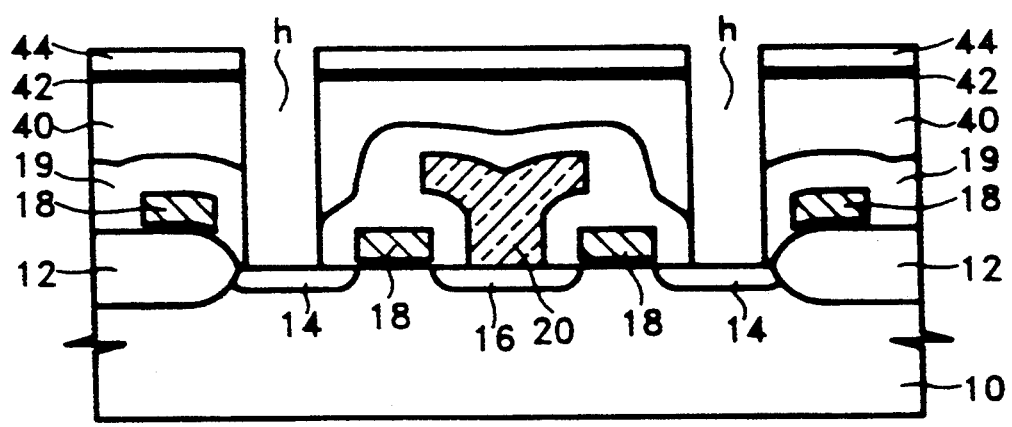
FIGS. 7 through 12 are cross-sectional views illustrating a method for manufacturing a semiconductor memory device capacitor according to a first embodiment of the present invention, taken along line AA' in FIG. 6.

FIG. 7 shows the steps of forming the transistors, a sacrificial layer 44 and contact holes (h). The transistors each have a source region 14 and a gate electrode 18 and share a common drain region 16. Bit line 20 is connected with drain region 16. The active region of semiconductor substrate 10 is divided into active and isolation regions by field oxide 12. Then, insulating layer 19 is formed on the entire surface of the resultant structure for insulating the transistors. Planarizing layer 40 is formed to planarize the resultant structure whose surface has become stepped as a result of the transistor formation step. Then, a material such as silicon nitride ($Si_3N_4$) is deposited to a thickness of 30~300 Å on planarizing layer 40 to form etch-blocking layer 42. A material such as an oxide is deposited to a thickness of about 1,000 Å on etch-blocking layer 42 to form sacrificial layer 44.

Sacrificial layer 44, etch-blocking layer 42, planarizing layer 40 and insulating layer 19, all of which are stacked on source region 14, are selectively removed by a photolithography process to form contact holes (h) for connecting a capacitor storage electrode to source region 14.

Figure 8:
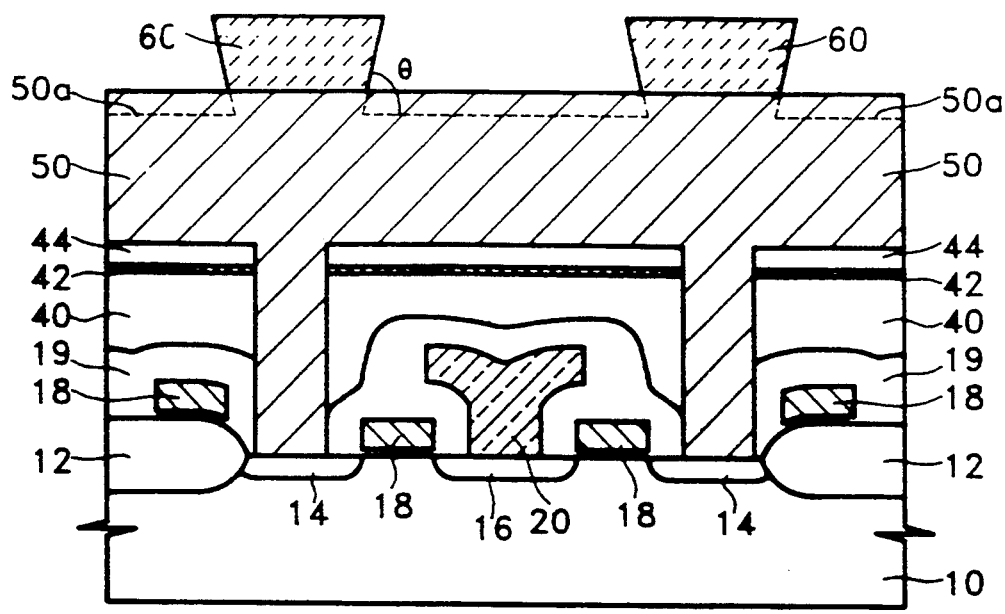

FIG. 8 shows the steps of forming conductive layer 50, photoresist pattern 60 and first step-portion 50a. A conductive material whose etch rate is different from that of the material constituting sacrificial layer 44 (that is, exhibiting an etch ratio of at least 4:1), e.g., impurity-doped polycrystalline silicon, is deposited to a thickness of 2,000~4,000 Å on the entire surface of semiconductor substrate 10 wherein a contact hole (h) is formed, to form conductive layer 50. Conductive layer 50 is preferably formed with a planarized surface. Then, after coating a photoresist to a thickness of about 1.2 μm on surface of conductive layer 50, the photoresist is patterned to form photoresist pattern 60. Conductive layer 50 is anisotropically etched to a depth of about 500 Å, using photoresist pattern 60 as an etch mask, to form first step-portion 50a in conductive layer 50. Preferably, the sidewall slope ($\theta$) of photoresist pattern 60 is negative ($\theta < 90°$) with respect to the surface of conductive layer 50 (to be explained later).

Figure 9:
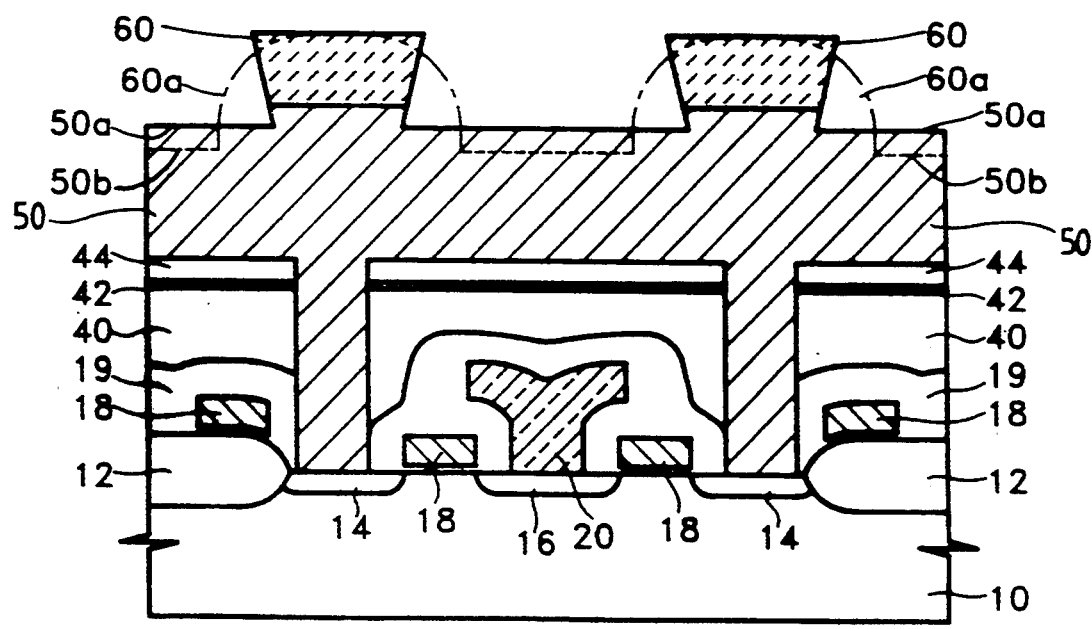
Figure 9A:
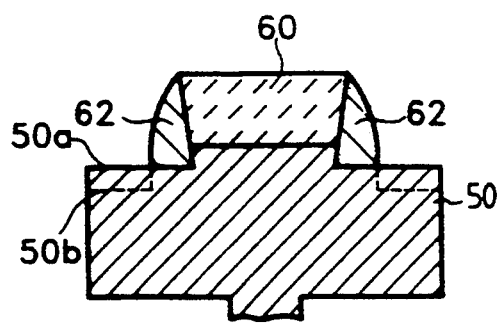
FIGS. 9A and 9B are cross-sectional views illustrating other methods for forming the first spacer shown in FIG. 9.
Figure 9B:
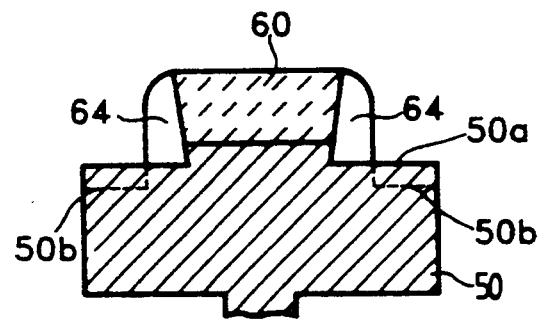

FIG. 9 shows the steps of forming first spacer 60a and second step-portion 50b, and FIGS. 9A and FIG. 9B show other methods for forming the first spacer as shown in FIG. 9.

As shown in FIG. 9, photoresist pattern 60 is flowed at a temperature of 50°~250° C. so that the photoresist diffuses laterally in a generally elliptical pattern to form first spacer 60a composed of the photoresist on the sidewalls of photoresist pattern 60. As the photoresist temperature is raised, the lateral diffusion area of the photoresist is increased. Since the width of first spacer 60a determines the thickness of the later-formed cylindrical electrode, the width of the spacer on the sidewall of photoresist pattern 60 is increased when the sidewall slope of photoresist pattern 60 is negative. In this manner, the thickness of the cylindrical electrode may be increased, thereby increasing cell capacitance.

Alternatively, the first spacer may be formed of a polymer 62 on the sidewalls of photoresist pattern 60 and on first step-portion 50a, as shown in FIG. 9A. An etch by-product polymer 62 can be formed by anisotropically etching conductive layer 50 to a predetermined depth by a plasma technique using $Cl_2O_2$ gas, or by anisotropically etching the entire surface of the resultant structure by a plasma technique using $CF_4$, $CHF_3$ and Ar gases. Using the latter method, polymer 62 can be formed without etching conductive layer 50.

Alternatively, the first spacer may be formed by anisotropically etching an oxide, as shown in FIG. 9B. An oxide which can be deposited at a temperature below 250° C., e.g., a silane-based oxide or PE-TEOS-based oxide, may be deposited on the entire surface of the resultant structure, and anisotropically etched by a reactive ion etching method, to form a first spacer 64 on the sidewalls of photoresist pattern 60 and first step-portion 50a.

The first spacer is formed at a temperature below 250° C. in both the photoresist flowing method and the oxide deposition method, and a heat cycle is not required. Therefore, regardless of the method used, the heat cycle is reduced, and the transistor electrical characteristics can be improved for highly integrated semiconductor devices. The aforementioned methods can be repeated to facilitate the formation of a large number of cylindrical electrodes.

After forming first spacer 60a, 62 or 64 by one of the methods illustrated in FIG. 9, FIG. 9A or FIG. 9B, conductive layer 50 having first step-portion 50a is anisotropically etched to a depth of about 500 Å, using the first spacer as an etch-mask, to thereby form a second step-portion 50b in conductive layer 50.

Figure 10:
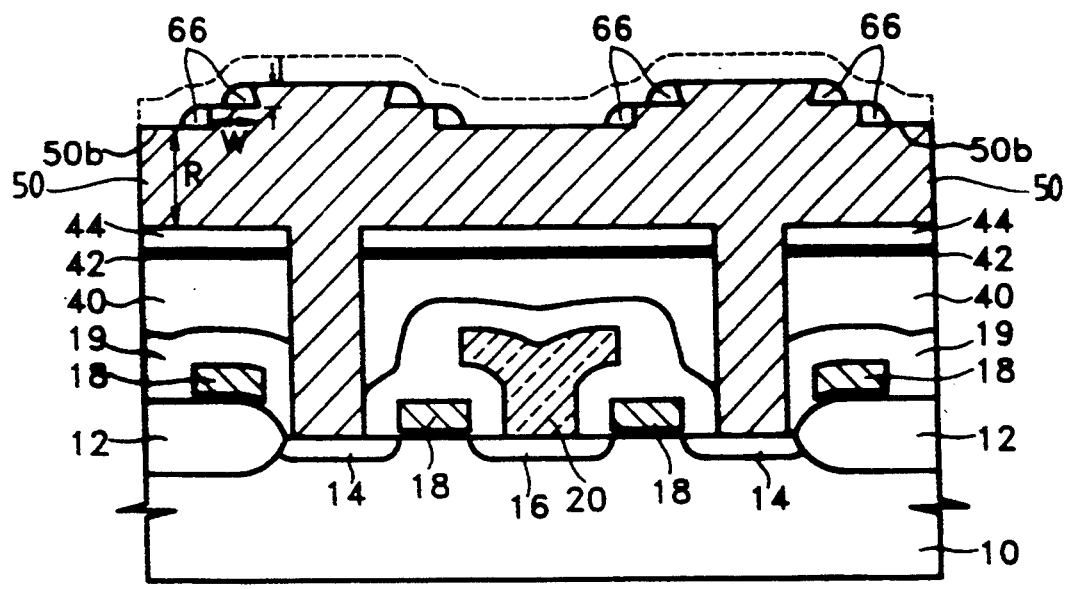

FIG. 10 shows the steps of forming a second spacer 66. After completely removing photoresist pattern 60 and the first spacer (60a in FIG. 9, 62 in FIG. 9A, or 64 in FIG. 9B), an oxide such as silicon dioxide ($SiO_2$) or high temperature oxide (HTO), or a nitride such as silicon nitride ($Si_3N_4$), is deposited to a thickness of 200~1,000 Å on the entire surface of resultant structure to form a first material layer (shown as a dotted line). A material which has an anisotropic which has an anisotropic etch rate different from that of the material constituting conductive layer 50 is used for the first material layer. The first material layer is formed to a thickness smaller than either the height (l) or the width (w) of the first step-portion 50a, to increase the process margin. The first material layer is anisotropically etched to form second spacer 66 on the sidewalls of first and second step-portions 50a and 50b in conductive layer 50.

Figure 11:
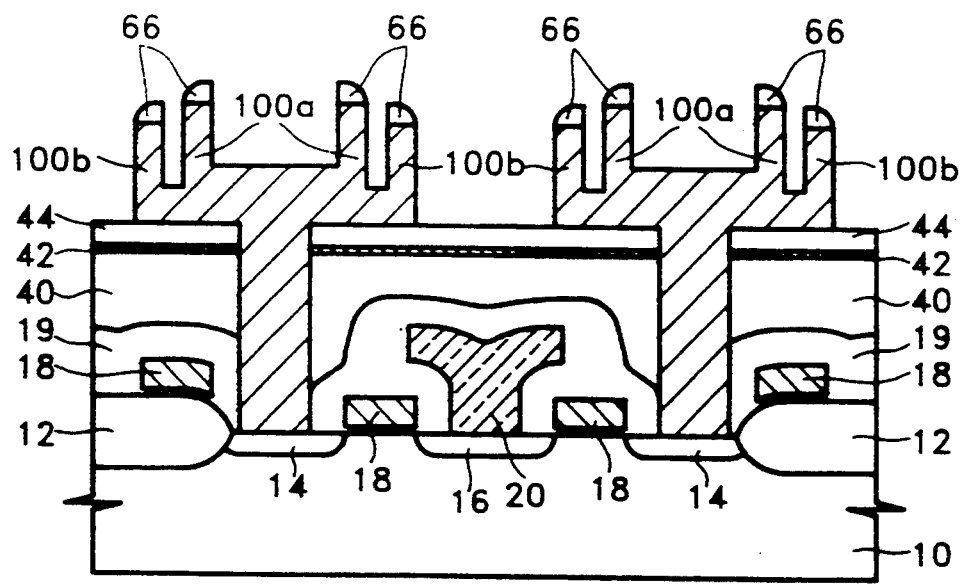

FIG. 11 shows the steps of forming cylindrical electrodes 100a and 100b. The entire surface of conductive layer 50 is anisotropically etched to a depth R (FIG. 10) equal to the smallest thickness of the conductive layer, using second spacer 66 as an etch mask, to form an inner cylindrical electrode 100a and an outer cylindrical electrode 100b of a storage electrode.

Figure 12:
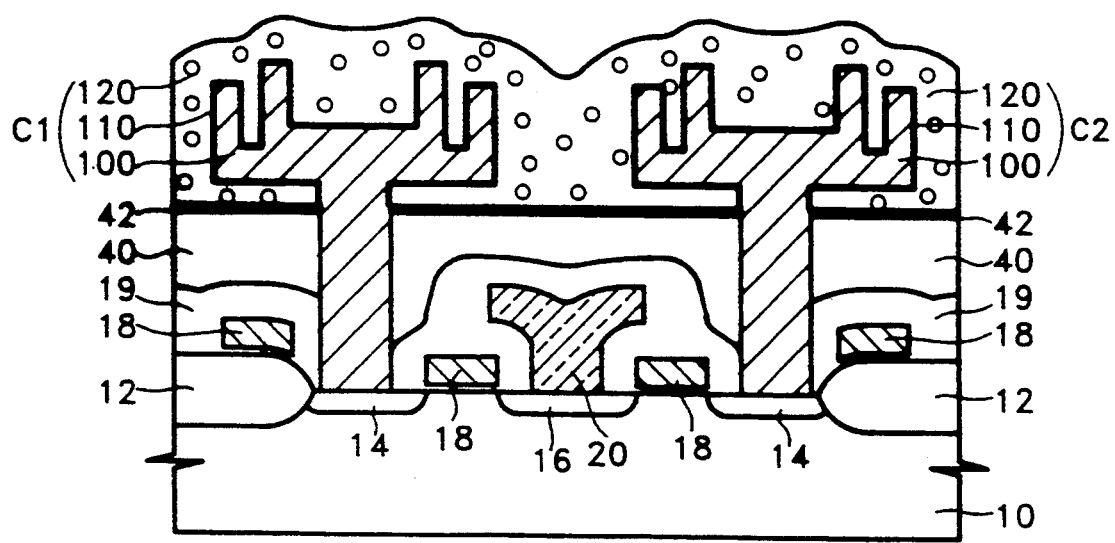

FIG. 12 shows the steps of forming a capacitor. After removing second spacer 66 and sacrificial layer 44, a high dielectric material, e.g., an oxide/nitride/oxide (ONO) or tantalum pentoxide ($Ta_2O_5$), is coated on the entire surface of the resultant structure to form dielectric film 110. A conductive material such as an impurity-doped polycrystalline silicon is deposited on dielectric film 110 to form plate electrode 120. Capacitors C1 and C2 are thus composed of storage electrode 100, dielectric film 110 and plate electrode 120. It will be appreciated that sacrificial layer 44 is provided so as to use the lower surface of storage electrode 100 as an effective capacitor area.

According to the first embodiment of the present invention, a simplified process and reduced heat cycle are possible.

FIGS. 13 through 17 are cross-sectional views illustrating a method for manufacturing a semiconductor memory device capacitor according to a second embodiment of the present invention.

Figure 13:
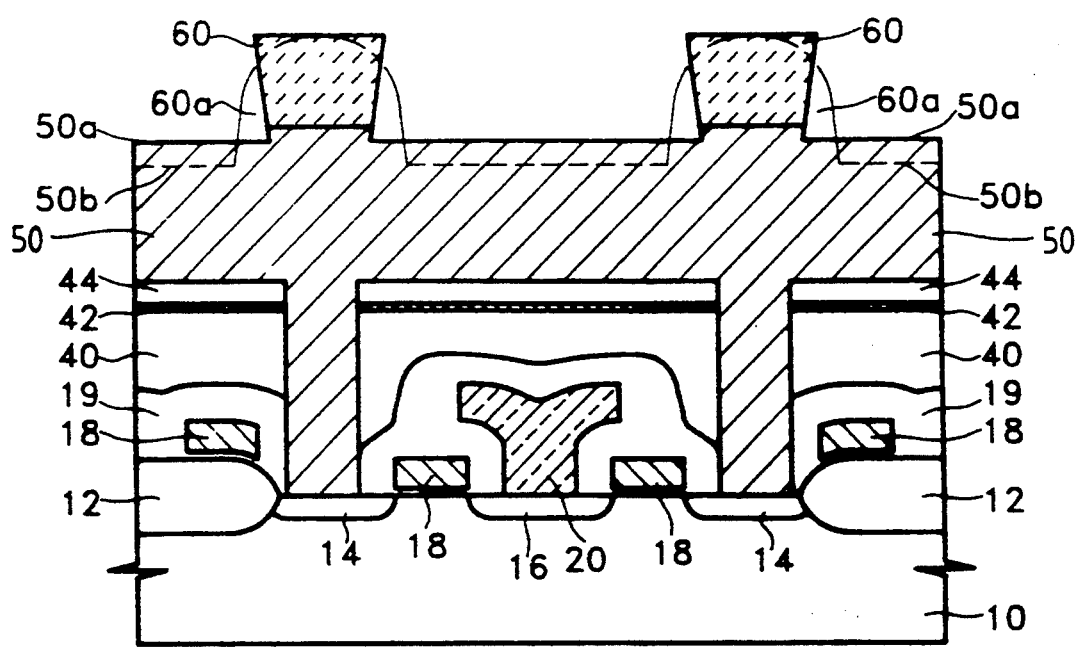
FIGS. 13 through 17 are cross-sectional views illustrating a method for manufacturing a semiconductor memory device capacitor according to a second embodiment of the present invention, taken along line AA' in FIG. 6.

FIG. 13 shows the steps of forming first and second photoresist patterns 60 and 60a and first and second step-portions 50a and 50b. A conductive layer 50 having a thickness of 2,000~4,000 Å is formed by the method described with reference to FIGS. 7 through 9. The entire surface of the resultant structure is coated with a photoresist, which is patterned to form first photoresist pattern 60. Thereafter, conductive layer 50 is anisotropically etched to a depth of 500 Å, using first photoresist pattern 60 as an etch mask, to form first step-portion 50a in conductive layer 50. The slope of the sidewall of first photoresist pattern 60 is preferably negative. First photoresist pattern 60 is flowed at a temperature of 50~250° C. so that the photoresist diffuses laterally in a generally elliptical pattern to form second photoresist pattern 60a. Conductive layer 50 is anisotropically etched to a depth of 500 Å, using second photoresist pattern 60a as an etch mask, to form second step-portion 50b in conductive layer 50.

Figure 14:
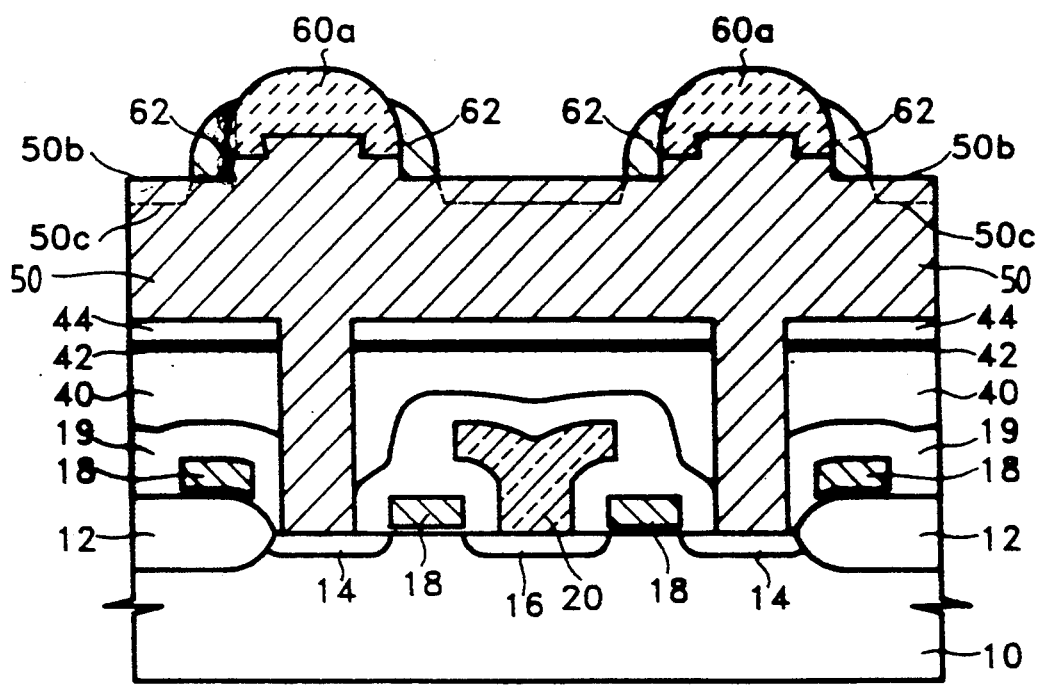

FIG. 14 shows the steps of forming a polymer 62 and a third step-portion 50c. Conductive layer 50 is anisotropically etched by a plasma technique using $Cl_2O_2$ gas, to form an etch by-product polymer 62 on the sidewall of second photoresist pattern 60a and second step-portion 50b. Polymer 62 may be formed by performing an anisotropic etching on the entire surface of the resultant structure according to a plasma technique using $CF_4$, $CHF_3$ and Ar gases, without etching conductive layer 50. Conductive layer 50 is anisotropically etched to a depth of 500 Å, using polymer 62 as an etch mask, to form third step-portion 50c in conductive layer 50.

Figure 15:
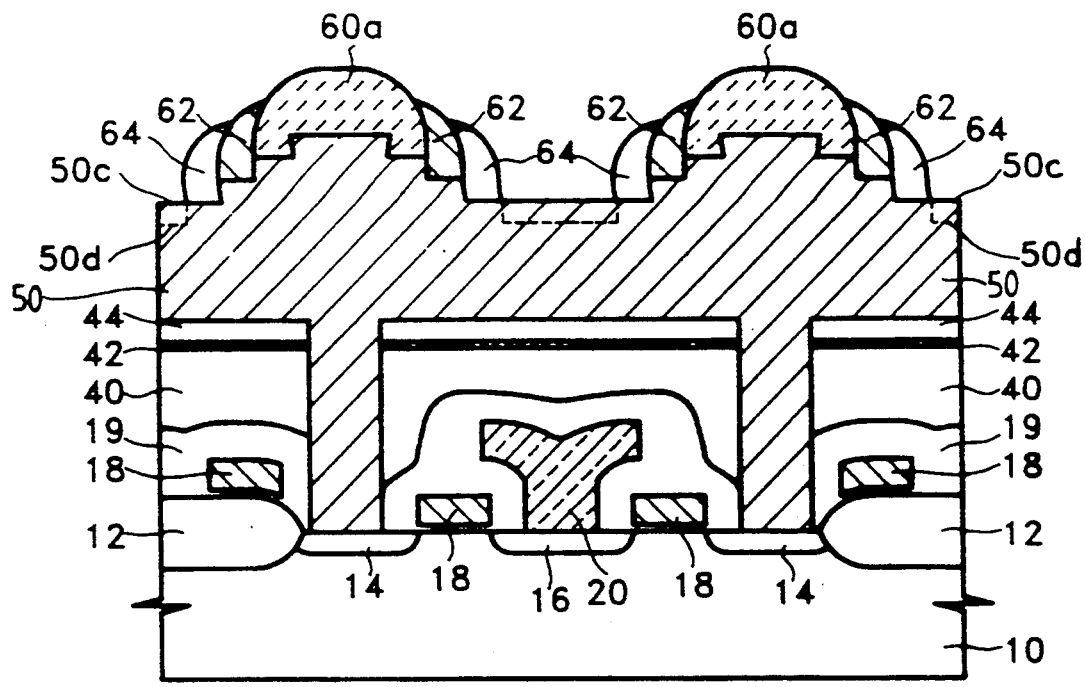

FIG. 15 shows the steps of forming first spacer 64 and fourth step-portion 50d. An oxide, e.g., a PE-TEOS-based oxide or a silane-based oxide, is deposited at a temperature below 250° C. on the entire surface of the resultant structure wherein third step-portion 50c is formed, to thereby form a first material layer (not shown). Then, the first material layer is etched by a reactive ion etching method to form first spacer 64, composed of the first material layer, on the sidewalls of polymer 62 and third step-portion 50c. Thereafter, conductive layer 50 is anisotropically etched to a depth of 500 Å, using first spacer 64 as an etch mask, to form fourth step-portion 50d in conductive layer 50.

Figure 16:
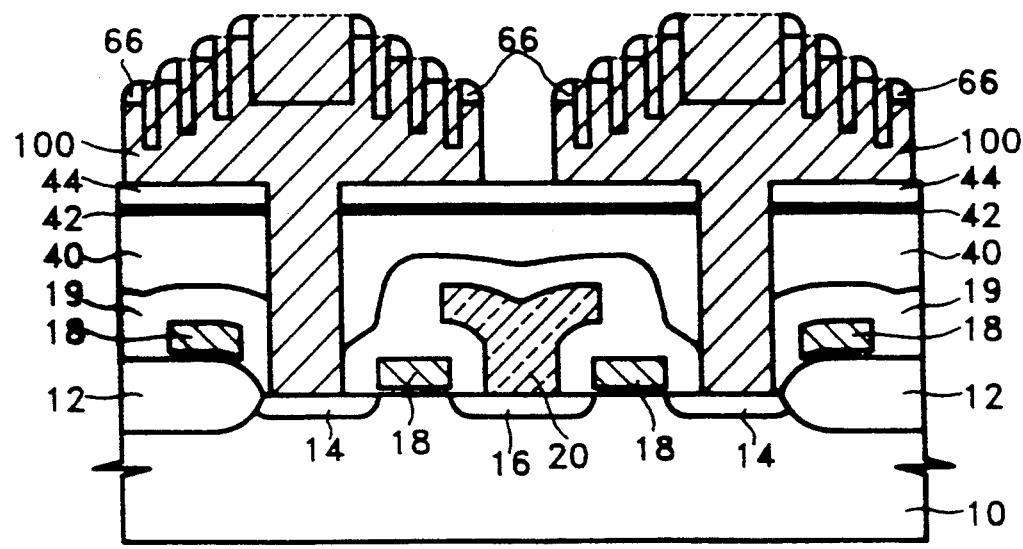

FIG. 16 shows the steps of forming second spacer 66 and storage electrode 100. After completely removing second photoresist pattern 60a, polymer 62, and first spacer 64, a material such as an oxide or a nitride is deposited to a thickness of 200~1,000 Å on the entire surface of resultant structure to form a second material layer (not shown). Preferably, the second material has an etch rate different from that of the material constituting conductive layer 50 with respect to any anisotropic etching process. The second material layer is anisotropically etched to form second spacer 66, composed of the second material layer, on the sidewalls of first through fourth step-portions 50a through 50d in conductive layer 50. Thereafter, conductive layer 50 is anisotropically etched, using second spacer 66 as an etch mask, to form storage electrode 100 composed of quadruple cylindrical electrodes.

Figure 17:
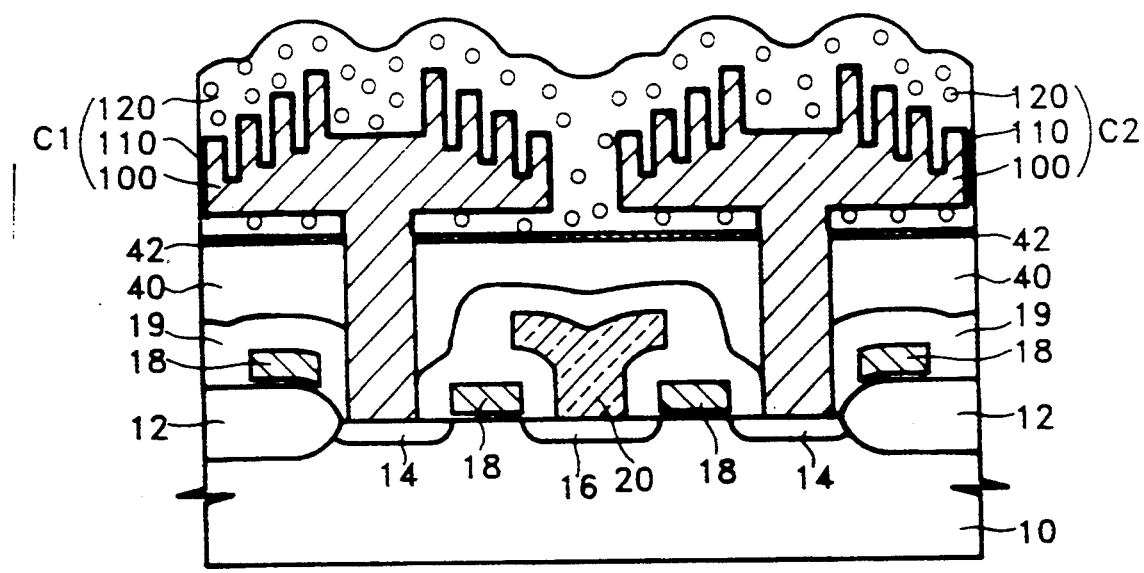

FIG. 17 shows the steps of forming a capacitor. After removing second spacer 66 and sacrificial layer 44, a high dielectric material, e.g., ONO or $Ta_2O_5$, is coated on the entire surface of the resultant structure to form a dielectric film 110. A conductive material, e.g., an impurity-doped polycrystalline silicon, is deposited on dielectric film 110 to form a plate electrode 120, to thereby complete the process of manufacturing a capacitor.

According to this second embodiment of the present invention, quadruple cylindrical electrodes can be formed by a simple process to achieve a higher cell capacitance than the first embodiment.

Figure 18:
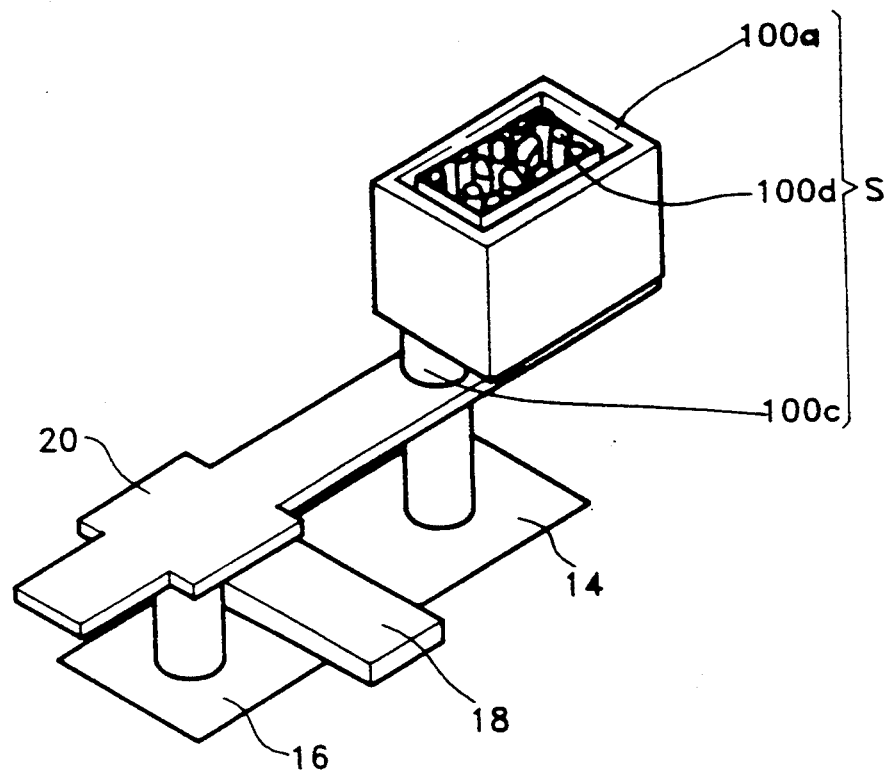
FIG. 18 is a perspective view of a semiconductor memory device manufactured according to a third embodiment of the present invention.

FIG. 18 is a perspective view of a semiconductor memory device which is manufactured according to a third embodiment of the present invention. Numerous micro trenches 100d are formed in the interior of single cylindrical electrode 100a. Here, single cylindrical electrode 100a and micro trenches 100d are connected by a base electrode 100c, thereby constituting a storage electrode (S).

FIGS. 19–23 are cross-sectional views illustrating a method for manufacturing a semiconductor memory device capacitor according to a second embodiment of the present invention.

Figure 19:
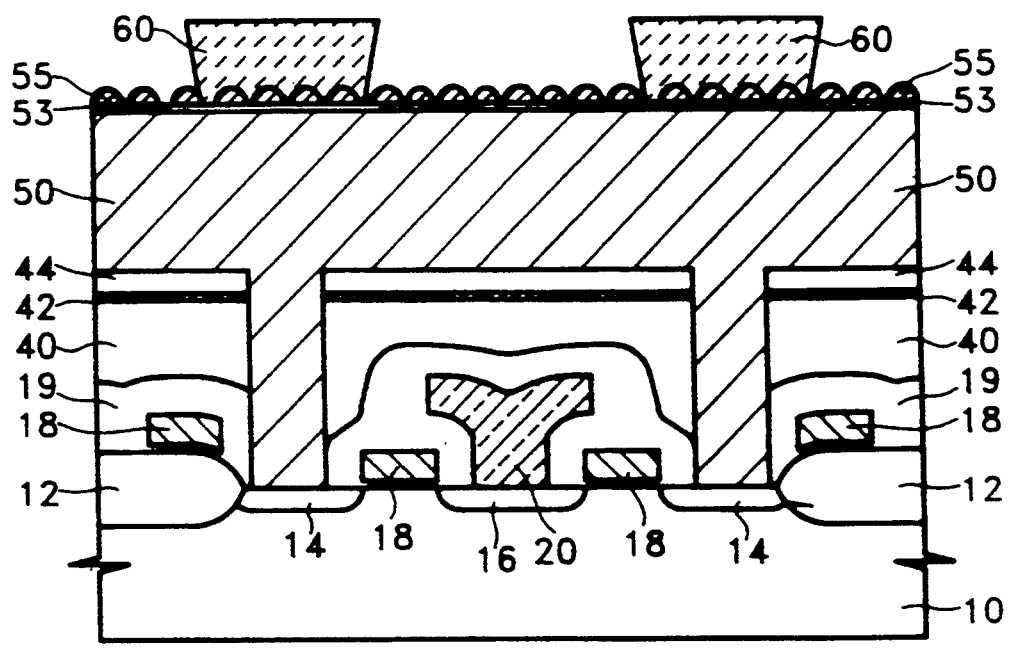
FIGS. 19 through 23 are cross-sectional views illustrating a method for manufacturing a semiconductor memory device capacitor according to the third embodiment of the present invention.

FIG. 19 shows the step of forming conductive layer 50, first material layer 53, hemispherical grain polycrystalline (hereinafter called HSG) layer 55 and photoresist pattern 60. After forming a transistor having a source region 14, a drain region 16, a gate electrode 18, and a contact hole for exposing source region 14 by the method described with reference to FIGS. 7 and 8, a conductive layer, e.g., an impurity-doped polycrystalline silicon, is deposited to a thickness of 2,000~4,000 Å on the entire surface of the resultant structure to form conductive layer 50. A material which has an etch rate different from that of conductive layer 50 with respect to any anisotropic etching process, e.g., an oxide, is deposited to a thickness of 300~1,000 Å on conductive layer 50 to form first material layer 53. Then, HSG layer 55 of polycrystalline silicon is formed on first material layer 53. HSG layer 55 may be formed under the conditions of 550° C. or 590° C. at 1.0 torr of pressure. When HSG layer 55 is formed on the oxide film, a small gap between grains constituting HSG layer 55 exists so that first material layer 53 is partially exposed between the grains of HSG layer 55.

A photoresist is coated to a thickness of about 1.2 μm on the entire surface of the resultant structure wherein HSG layer 55 is formed and patterned to form photoresist pattern 60. The slope of the sidewall of photoresist pattern 60 is preferably negative.

Figure 20:
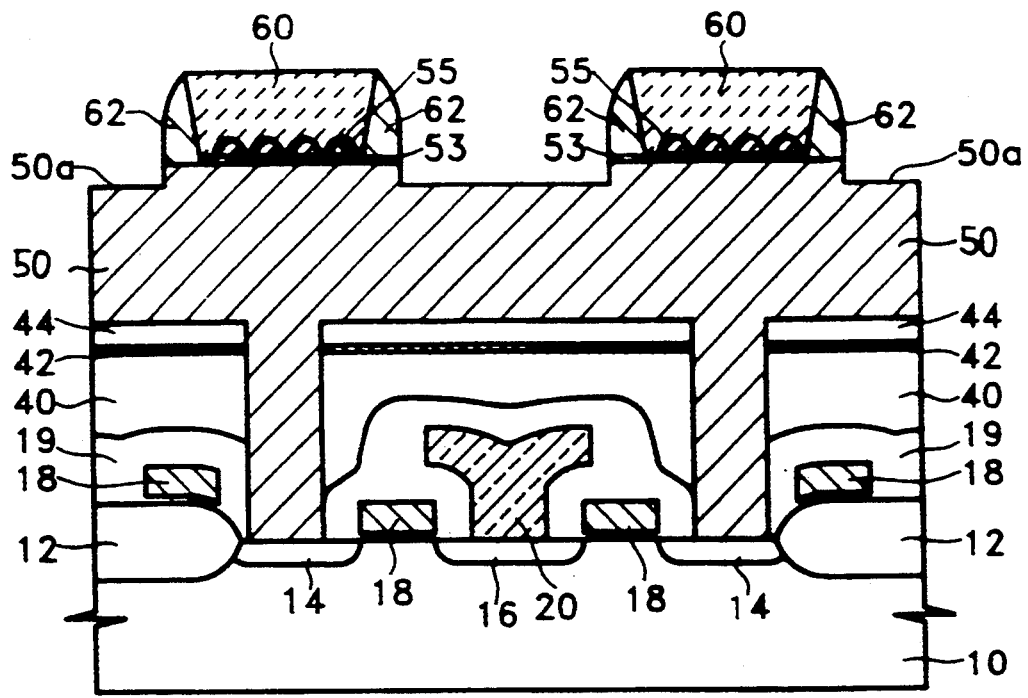
Figure 20A:
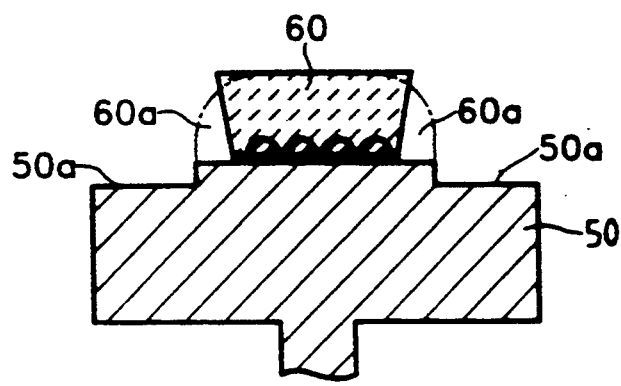
FIG. 20A is cross-sectional view illustrating another method for forming the first spacer as shown in FIG. 20.

FIG. 20 shows the steps of forming first spacer 62 and first step-portion 50a, and FIG. 20A shows another method for forming the first spacer as shown in FIG. 20. HSG layer 55 and first material layer 53 are each anisotropically etched, in sequence, using photoresist pattern 60 as an etch mask leaving HSG layer 55 and first material 53 only under photoresist pattern 60. Then, an anisotropic etching process is performed by a plasma technique using $CF_4$, $CHF_3$ and Ar gas on the entire surface of the resultant structure to form first spacer 62, which is composed of a polymer, on the sidewall of photoresist pattern 60. Also, as shown in FIG. 20A, photoresist pattern 60 may be flowed at a temperature of 50~250° C. so that the photoresist diffuses laterally in a generally elliptical shape, to form first spacer 60a, composed of photoresist, on the sidewall of photoresist pattern 60.

Then, conductive layer 50 is etched to a depth of 500~1,000 Å, using first spacer 62 or 60a as an etch mask, to form a first step-portion 50a in conductive layer 50.

Figure 21:
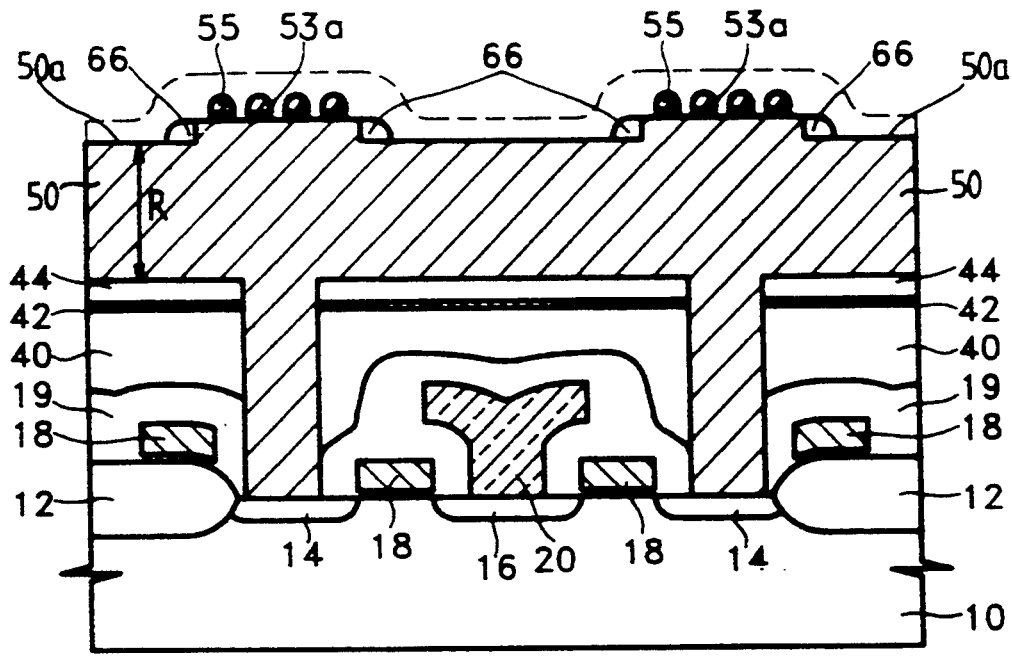

FIG. 21 shows the steps of forming a second spacer 66 and a first material layer pattern 53a. After completely removing photoresist pattern 60 and the first spacer (62 in FIG. 20 or 60a in FIG. 20A), an oxide is deposited to a thickness less than the height of first step-portion 50a on the entire surface of resultant structure, to form a second material layer (shown as a dotted line). Preferably, the second material layer has an etch rate different from that of conductive layer 50 and the same or a similar as that of first material layer 53 with respect to any anisotropic etching process. The second material layer is anisotropically etched to form second spacer 66, composed of the second material layer on the sidewalls of first step-portion 50a. Since first material layer 53 has an etch rate which is the same as or similar to that of the second material layer, a region of first material layer whose surface is partially exposed through HSG layer 55 is removed during the above anisotropic etching process to form first material layer pattern 53a under HSG layer 55.

Figure 22:
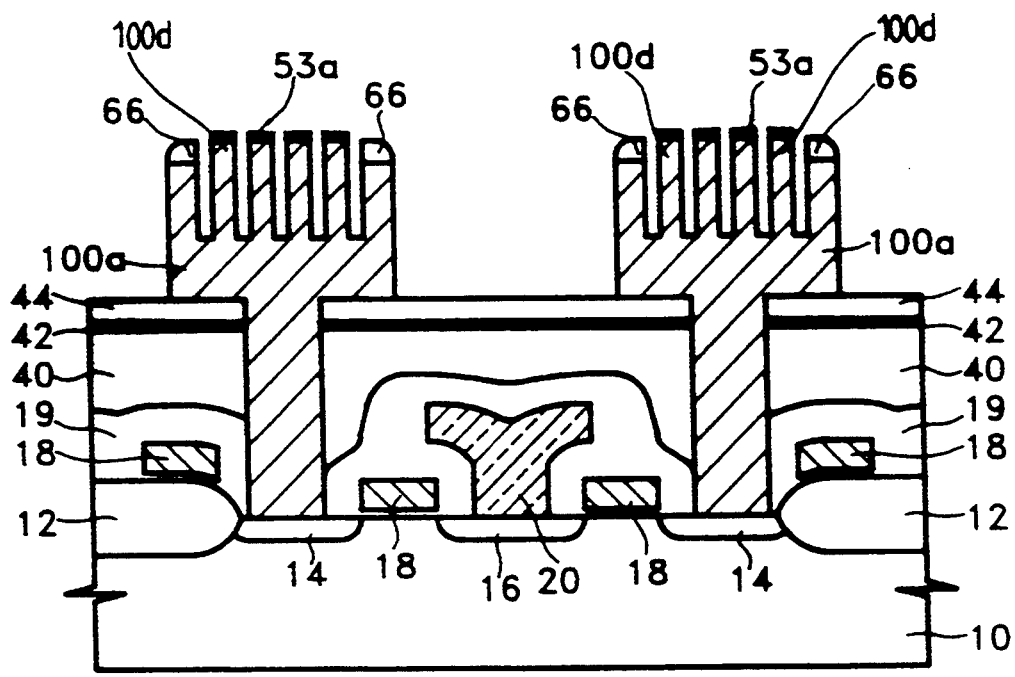

FIG. 22 shows the steps of forming cylindrical electrode 100a and micro trenches 100d. HSG layer 55 and conductive layer 50 are anisotropically etched by the smallest thickness of conductive layer (reference numeral R in FIG. 21), using second spacer 66 and first material layer pattern 53a as an etch mask. This results in a storage electrode composed of single cylindrical electrode 100a having numerous micro trenches 100d.

Figure 23:
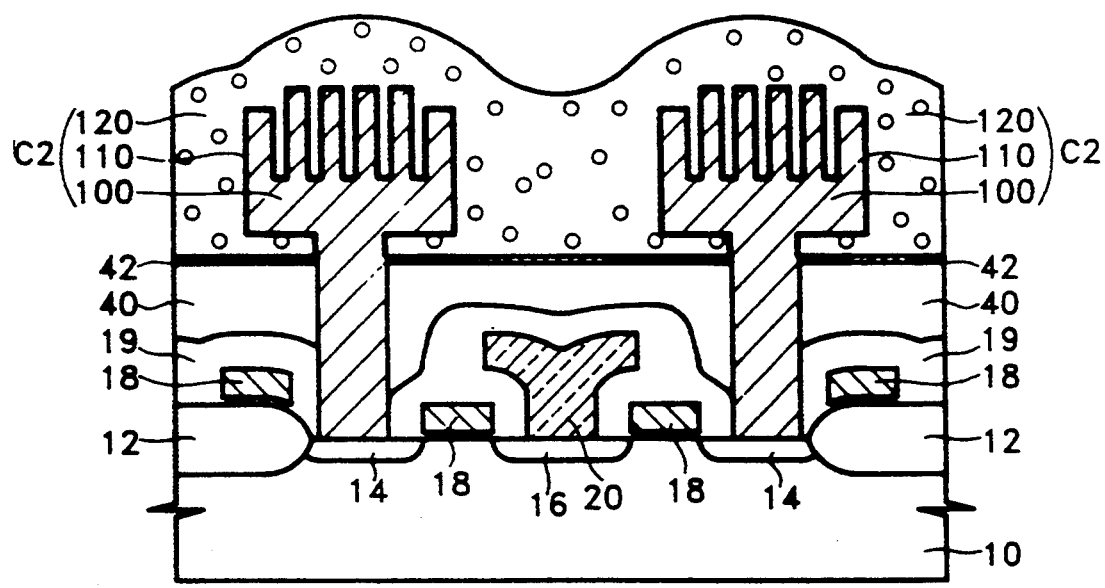

FIG. 23 shows the steps of forming a capacitor. After removing second spacer 66, sacrificial layer 44 and first material layer pattern 53a, a high dielectric material, e.g., ONO or $Ta_2O_5$, is coated on the entire surface of the resultant structure to form a dielectric film 110. A conductive material, e.g., an impurity-doped polycrystalline silicon, is deposited on dielectric film 110 to form plate electrode 120, thereby completing capacitors C1 and C2, which are composed of storage electrode 100, dielectric film 110 and plate electrode 120.

According to the third embodiment of the present invention, numerous micro trenches are formed in the interior of the cylindrical electrode to increase cell capacitance. The method for forming the first spacer can be repeated to increase the number of cylindrical electrodes.

FIGS. 24 through 27 are cross-sectional views for illustrating a method for manufacturing a capacitor of a semiconductor memory device according to a fourth embodiment of the present invention.

Figure 24:
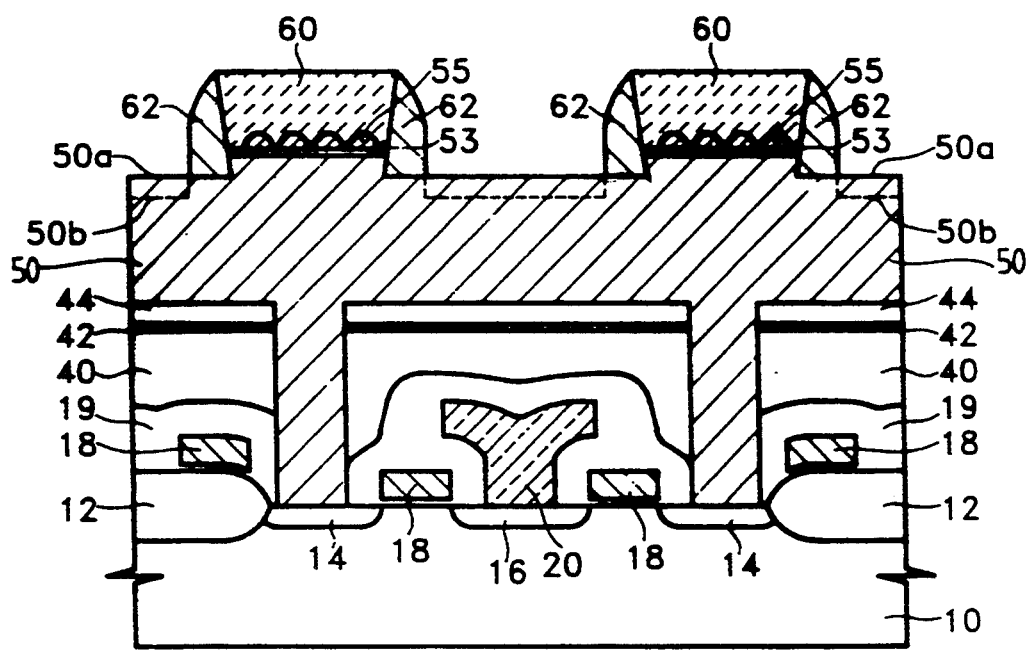
FIGS. 24 through 27 are cross-sectional views illustrating a method for manufacturing a semiconductor memory device capacitor according to a fourth embodiment of the present invention, taken along line AA' in FIG. 6.

FIG. 24 shows the steps of forming first spacer 62 and first and second step-portions 50a and 50b. After forming photoresist pattern 60 on HSG layer 55 by the method described with reference to FIG. 19, HSG layer 55 is anisotropically etched, using photoresist pattern 60 as an etch mask. Successively, first material layer 53 and conductive layer 50 are anisotropically etched to a depth of 500 Å. As a result, first step-portion 50a is formed in conductive layer 50, and HSG layer 55 and first material layer 53 remain only under photoresist pattern 60. Conductive layer 50 is anisotropically etched by a plasma technique using $Cl_2O_2$ gas to form first spacer 62 on the sidewall of photoresist pattern 60 and first step-portion 50a. As described with reference to FIG. 20, first spacer 62 may be formed by performing an anisotropic etching on the entire surface of the resultant structure, according to a plasma technique using $CF_4$, $CHF_3$ and Ar gases without etching conductive layer 50. First spacer 62 may be formed by flowing photoresist pattern 60 at a temperature of 50°~250° C. so that the photoresist diffuses laterally in a generally elliptical pattern.

Then, conductive layer 50 is anisotropically etched to a depth of 500 Å, using first spacer 62 as an etch mask, to thereby form second step-portion 50b in conductive layer 50.

Figure 25:
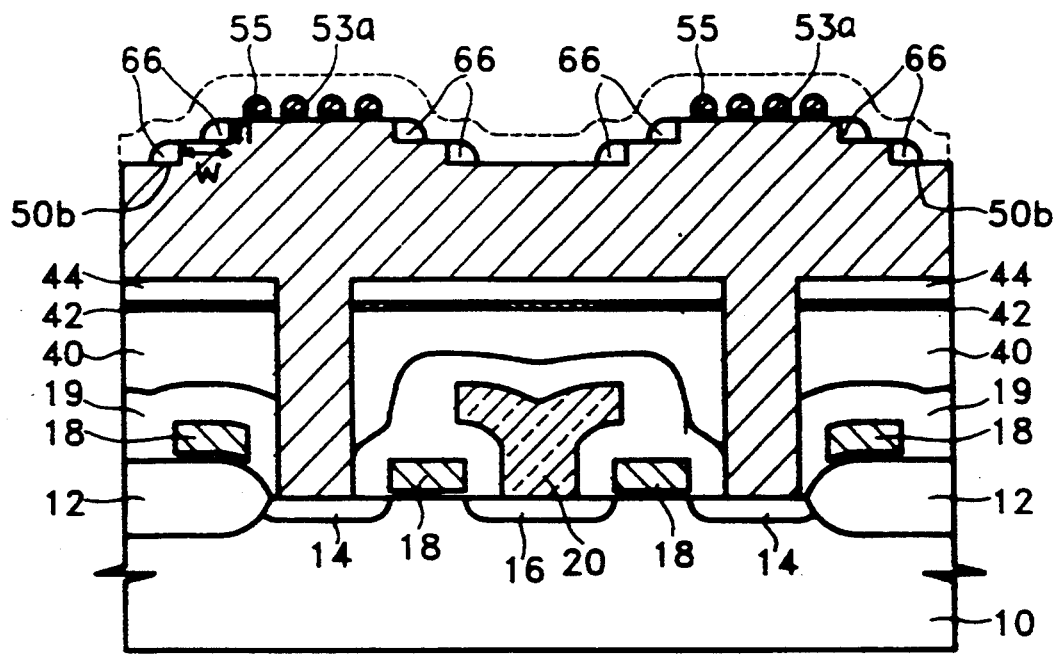

FIG. 25 shows the steps of forming second spacer 66 and first material layer pattern 53a. After completely removing photoresist pattern 60 and first spacer 62, a material, e.g., an oxide, is deposited on the entire surface of the resultant structure to form a second material layer (shown as a dotted line). Preferably, the second material has an etch rate different from that of the material constituting conductive layer 50 and the same as or similar to that of first material layer 53 with respect to any anisotropic etching process. The second material layer is preferably formed to a thickness smaller than either the height (l) or the width (w) of the first step-portion. Thereafter, the second material layer is anisotropically etched to form second spacer 66, composed of the second material layer, on the sidewalls of first and second step-portions 50a and 50b. Since first material layer 53 has the same or a similar etch rate as that of the second material layer, a region of first material layer whose surface is exposed through HSG layer 55 is removed to form first material layer pattern 53a under HSG layer 55.

Figure 26:
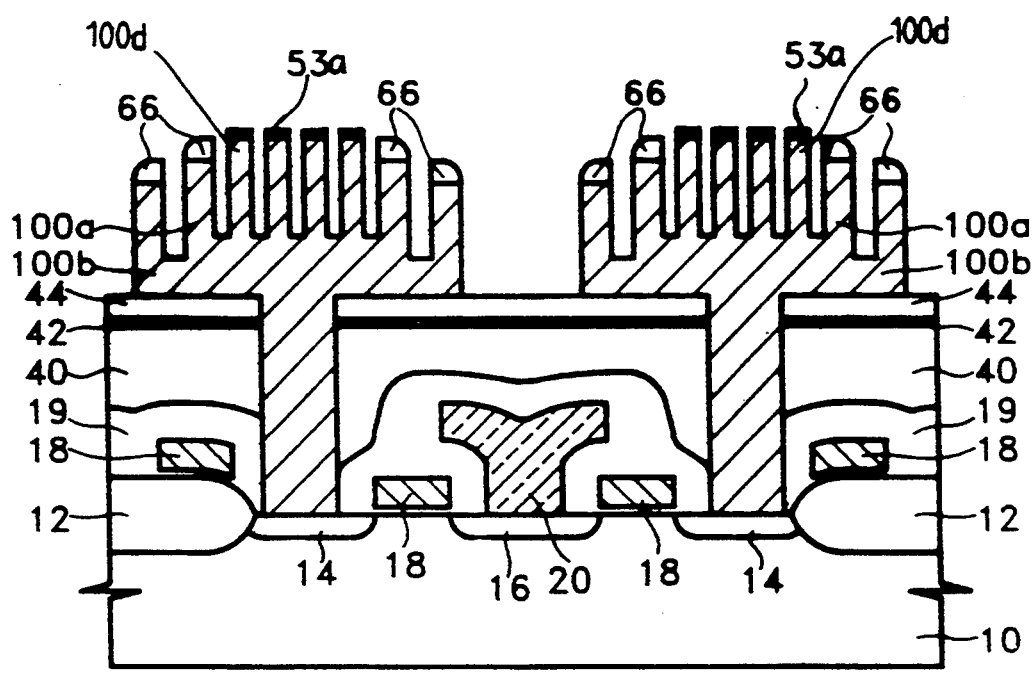

FIG. 26 shows the steps of forming cylindrical electrode 100a and 100b and micro trenches 100d. HSG layer 55 and conductive layer 50 are anisotropically etched by the smallest thickness of the conductive layer, using second spacer 66 and first material layer pattern 53a as an etch mask, to form a storage electrode composed of double cylindrical electrodes 100a and 100b having numerous micro trenches 100d.

Figure 27:
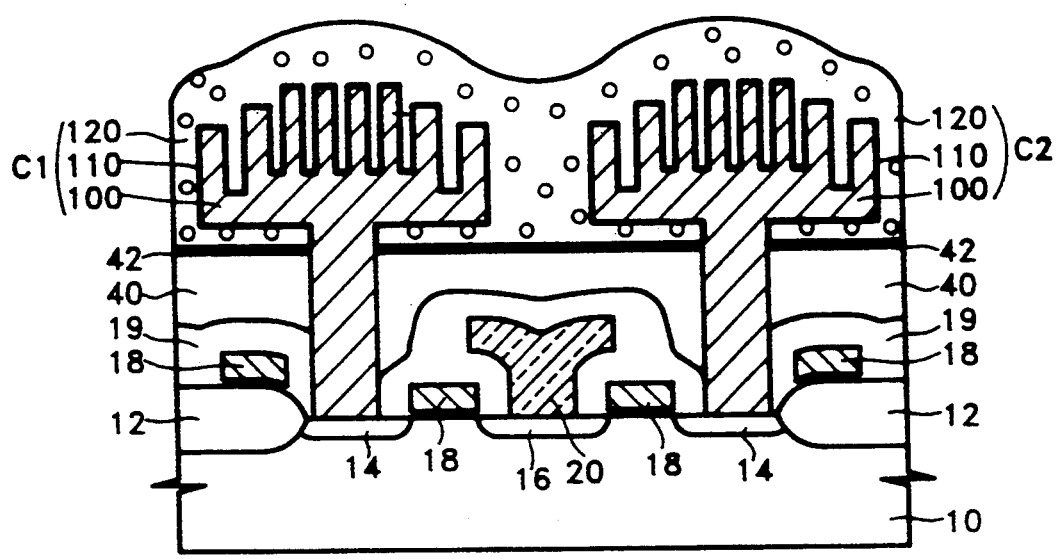

FIG. 27 shows the step of forming a capacitor. After removing second spacer 66 and sacrificial layer 44, a high dielectric material, e.g., ONO or $Ta_2O_5$ is coated on the entire surface of the resultant structure to form a dielectric film 110. A conductive material, e.g., an impurity-doped polycrystalline silicon, is deposited on dielectric film 110 to form a plate electrode 120.

According to the fourth embodiment of the present invention, double cylindrical electrodes having numerous micro trenches therein are formed to increase cell capacitance over that of the third embodiment. Also, the method for forming the first spacer can be repeated to increase the number of outer cylindrical electrodes.

Therefore, according to the present invention, cell capacitance is easily increased by a simple process and the heat cycle is considerably reduced. The method of the present invention can be adapted to highly integrated semiconductor memory devices of 256 Mb or higher in capacity.

It will be understood by those skilled in the art that the foregoing description of a preferred embodiment of the present invention is illustrative and not limiting. Various changes and modifications may be made without departing from the spirit and scope of the invention, as defined by the appended claims and their equivalents.

What is claimed is:

1. A method for manufacturing a capacitor of a semiconductor memory device, comprising the steps of:
    forming a conductive layer on a semiconductor substrate;
    forming a photoresist pattern on said conductive layer;
    etching said conductive layer, using said photoresist pattern as a mask, to form a first step-portion in said conductive layer;
    forming a first spacer on a sidewall of said photoresist pattern and said first step-portion;
    etching said conductive layer, using said first spacer as a mask, to form a second step-portion in said conductive layer;
    removing said photoresist pattern and said first spacer to form a resultant structure;
    forming a first material layer on said resultant structure;
    etching said first material layer to form a second spacer on a sidewall of said first and second step-portions;
    etching said conductive layer, using said second spacer as a mask, to form a storage electrode of a capacitor; and
    removing said second spacer.

2. The method of claim 1, wherein said step of forming said first spacer is performed more than once.

3. The method of claim 1, wherein said sidewall of said photoresist pattern has a negative slope.

4. The method of claim 1, wherein said first spacer is formed by flowing said photoresist pattern so that the photoresist diffuses laterally.

5. The method of claim 4, wherein said flowing is performed at a temperature of about 50°-250° C.

6. The method of claim 1, wherein said first spacer is formed as an etch by-product of an anisotropic etching process.

7. The method of claim 6, wherein said anisotropic etching process for forming said etch by-product is performed by a plasma technique using $CF_4$, $CHF_3$ and Ar gases.

8. The method of claim 6, wherein said anisotropic etching process for forming said etch by-product is performed by a plasma technique using $Cl_2O_2$ gas.

9. The method of claim 1, wherein said first spacer is formed by depositing a second material layer on the etched conductive layer and by anisotropically etching said second material layer.

10. The method of claim 9, wherein said second material layer is an oxide which can be deposited at a temperature below 250° C.

11. The method of claim 1, wherein said first material layer is formed to a thickness smaller than either the height or the width of said first step-portion.

12. The method of claim 1, wherein said first material layer has an etch rate different from that of said conductive layer with respect to any anisotropic etching process.

13. The method of claim 1, wherein said step of etching said conductive layer is performed by etching said conductive layer on the basis of the thickness thereof.

14. A method for manufacturing a capacitor of a semiconductor memory device, comprising the steps of:
    forming a conductive layer of a first material on a semi conductor substrate;
    forming a first photoresist pattern on said conductive layer;

etching said conductive layer, using said first photoresist pattern as a mask, to form a first step-portion in said conductive layer;

flowing said first photoresist pattern to form a second photoresist pattern;

etching said conductive layer, using second photoresist pattern as a mask, to form a second step-portion in said conductive layer;

forming an anisotropic etch by-product on a sidewall of said second photoresist pattern;

etching said conductive layer, using said etch by-product as a mask, to form a third step-portion in said conductive layer;

forming a first spacer on a sidewall of said etch by-product;

etching said conductive layer, using said first spacer as a mask, to form a fourth step-portion in said conductive layer;

removing said second photoresist patterns, said etch by-product and said first spacer to form a resultant structure;

forming a second material layer on the entire surface of said resultant structure;

etching said second material layer to form a second spacer on the sidewalls of said first through fourth step-portions;

etching said conductive layer, using said second spacer as a mask, to form a storage electrode of a capacitor; and removing said second spacer.

15. The method of claim 14, wherein said step of etching said conductive layer is performed by etching said conductive layer on the basis of the thickness thereof.

16. The method of claim 14, wherein said second material layer is an oxide which can be deposited at a temperature below 250° C.

17. The method for manufacturing a capacitor of a semiconductor memory device, comprising the steps of:
forming a conductive layer on a semiconductor substrate;

sequentially forming a first material layer and a polycrystalline layer of hemispherical grains, on said conductive layer;

forming a photoresist pattern on said polycrystalline layer;

etching said polycrystalline layer and said first material layer, using said photoresist pattern as a mask, to leave said polycrystalline layer and said first material layer only under said photoresist pattern;

forming a first spacer on a sidewall of said photoresist pattern;

etching said conductive layer, using said first spacer as a mask, to form a step-portion in said conductive layer;

removing said photoresist pattern and said first spacer to form a resultant structure;

forming a second material layer on the entire surface of said resultant structure;

etching said second material layer to simultaneously form a second spacer on a sidewall of said step-portion and a first material layer pattern only under said polycrystalline layer;

etching said conductive layer, using said second spacer and said first material pattern as a mask, to thereby form a storage electrode of a capacitor; and removing said second spacer and said first material pattern.

18. The method of claim 17, wherein the slope of said sidewall of said photoresist pattern is negative.

19. The method of claim 17, wherein said step of forming said first spacer is performed more than once.

20. The method of claim 19, wherein said first spacer is formed by an anisotropic etching process of a plasma technique using $CF_4$, $CHF_3$ and Ar gases.

21. The method of claim 19, wherein said first spacer is formed by flowing said photoresist pattern so that the photoresist diffuses laterally.

22. The method of claim 19, wherein said step of etching said conductive layer is performed by etching said conductive layer on the basis of the thickness thereof.

23. A method for manufacturing a capacitor of a semiconductor memory device, comprising the steps of:
forming a conductive layer on a semiconductor substrate;

sequentially forming a first material layer and a polycrystalline silicon layer of hemispherical grains, on said conductive layer;

forming a photoresist pattern on said polycrystalline layer;

etching said polycrystalline layer, said first material layer and said conductive layer, using said photoresist pattern as a mask, to simultaneously form a first step-portion in said conductive layer, and leave said polycrystalline layer and said first material layer only under said photoresist pattern;

forming a first spacer on a sidewall of said photoresist pattern;

etching said conductive layer, using said first spacer as a mask, to form a second step-portion in said conductive layer;

removing said photoresist pattern and said first spacer to form a resultant structure;

forming a second material layer on the entire surface of said resultant structure;

etching said second material layer to simultaneously form a second spacer on a sidewall of said first and second step-portions, and a first material layer pattern only under said polycrystalline layer;

etching said conductive layer, using said second spacer and said first material layer pattern as a mask, to thereby form a storage electrode of a capacitor; and removing said second spacer and said first material layer pattern.

* * * * *